United States Patent [19]

Metteer et al.

[11] 4,119,927
[45] Oct. 10, 1978

[54] CONSTANT RATE SWEEP FREQUENCY GENERATOR

[75] Inventors: N. Bruce Metteer; John D. Quick, both of Phoenix, Ariz.

[73] Assignee: Motorola Inc., Schaumburg, Ill.

[21] Appl. No.: 814,011

[22] Filed: Jul. 8, 1977

[51] Int. Cl.² .................. H03B 3/04; H03B 23/00
[52] U.S. Cl. ................................. 331/11; 331/4; 331/14; 331/178
[58] Field of Search .............. 331/4, 11, 14, 18, 25, 331/178

[56] References Cited

U.S. PATENT DOCUMENTS

| | | | |
|---|---|---|---|
| 3,221,266 | 11/1965 | Vitkovits, Jr. | 331/4 X |
| 3,382,460 | 5/1968 | Blitz et al. | 331/178 |
| 3,530,399 | 9/1970 | Goggins, Jr. | 331/178 X |
| 3,638,135 | 1/1972 | Stover | 331/14 |

*Primary Examiner*—Siegfried H. Grimm
*Attorney, Agent, or Firm*—Eugene A. Parsons

[57] ABSTRACT

A variable frequency oscillator including a nonlinear element for varying the frequency has alternately attached thereto a phase lock loop for maintaining the base or starting frequency of the oscillator substantially constant, and a sweep generator with a rate error loop for sensing the frequency linearity of the output sweep and altering the input signal to maintain the output linear.

4 Claims, 2 Drawing Figures

CONSTANT RATE SWEEP FREQUENCY GENERATOR

BACKGROUND OF THE INVENTION

A sweep frequency generator provides an output signal which is maintained at a basic or starting frequency and periodically sweeps linearly through a given frequency range. High linearity sweep frequency generators are used in spectrum analyzers, detection and surveillance receivers, and similar type devices for electrically sweeping through a desired range of frequencies. In general, the accuracy of the apparatus is dependent upon the linearity of the sweep from the generator.

In the prior art, many schemes have been devised for including a variable frequency oscillator in a feedback loop to correct the linearity. An example of one such scheme is described in U.S. Pat. No. 3,382,460, entitled "Linearly Swept Frequency Generator", patented May 7, 1968. In the patent described, the output of a voltage controlled oscillator is sampled at intervals, generally at an integral number of cycles, and, if the generator output frequency changes at the correct rate the sampled phases will all be identical. Any variation in the sampled phase is applied to the oscillator as an error signal. This sampling of the output frequency with time leaves room for error and can be a relatively complicated timing problem. Further, because of the periodic sampling at integral numbers of cycles and the inherent timing problems, this system becomes difficult at high speeds.

SUMMARY OF THE INVENTION

The present invention pertains to a constant rate sweep frequency generator including a variable frequency oscillator with a nonlinear element for varying the frequency with a phase lock loop attached to the nonlinear element for controlling the frequency of the oscillator between sweeps, or during retrace, and a sweep generator attached to the nonlinear element of the oscillator during the sweeps with a rate error loop also attached to the oscillator for continuously sensing the rate linearity of the output signal and adding a signal to the output of the sweep generator to maintain a constant rate of change of the signal out of the oscillator.

It is an object of the present invention to provide a new and improved constant rate sweep frequency generator.

It is a further object of the present invention to provide a constant rate sweep frequency generator embodying a relatively simple, low cost analog technique.

It is a further object of the present invention to provide a constant rate sweep frequency generator which is capable of providing a relatively high sweep rate and sweep repetition rate.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
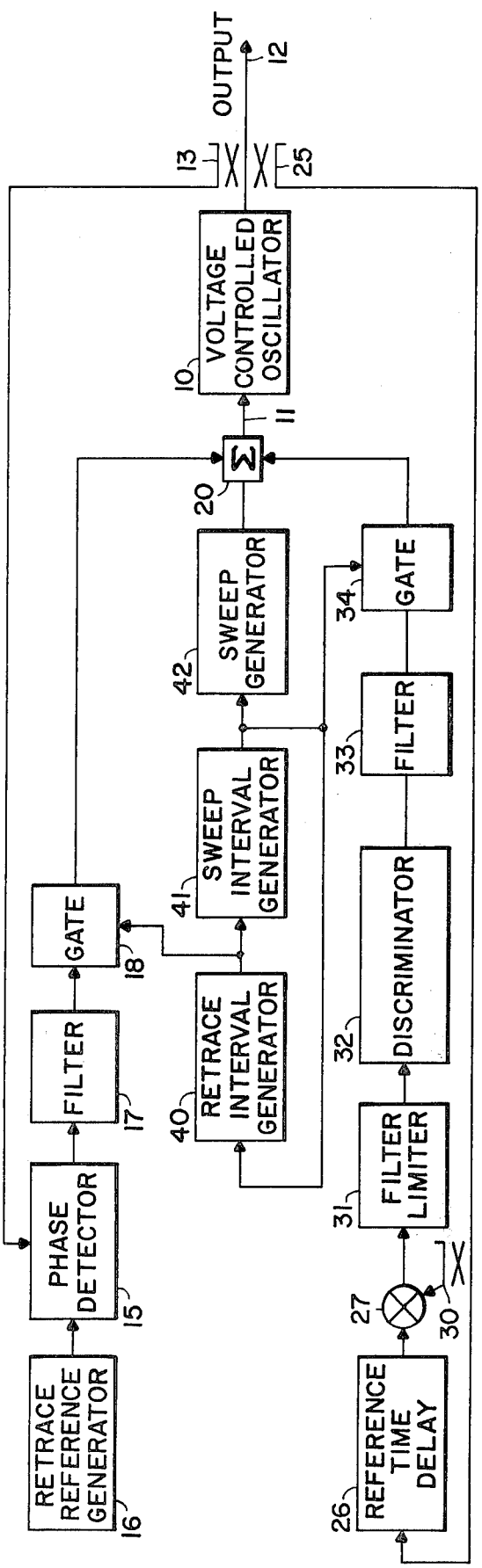
FIG. 1 is a block diagram of a constant rate sweep frequency generator embodying the present invention.

In the present embodiment a variable frequency oscillator, such as voltage controlled oscillator 10 which may include a nonlinear element, such as a Varicap or the like, for tuning in response to a voltage applied thereto, has a control input 11 and a sweep frequency output 12. A portion of the output signal from the oscillator 10 is coupled by a sensing device 13 to one input of a phase detector 15. A second input of the phase detector 15 has a reference generator 16 connected thereto and the output of the phase detector 15 is connected through a loop filter 17 and gate 18 to one input of a summing device 20. An output of the summing device 20 is connected to the control input 11 of the voltage controlled oscillator 10. The voltage controlled oscillator 10, phase detector 15, reference generator 16 and loop filter 17 form a conventional phase locked loop which, when the gate 18 is closed, phase locks the output of the voltage controlled oscillator 10 to the reference frequency from the reference generator 16.

A portion of the output of the voltage controlled oscillator 10 is also coupled by way of a second sensing device 25 to a time delay means 26. The delay means 26 may simply be a linear delay line or the like which delays the input signal thereto by a predetermined amount and provides a signal at the output which is an exact duplicate of the input signal, but delayed in time. The delayed output signal from the delay means 26 is applied to one input of a mixer 27 and a portion of the signal from the sensing device 25 is coupled to a second input of the mixer 27 by a sensing device 30. The output of the mixer 27 is applied through a filter-limiter 31 to a discriminator 32. The discriminator 32 is a standard discriminator, such as a Foster-Seeley or the like, and supplies a signal at the output thereof which is a DC signal that varies as a function of frequency. The signal from the discriminator 32 is supplied through a loop filter 33 and gate 34 to a second input of the summing device 20.

Figure 2:
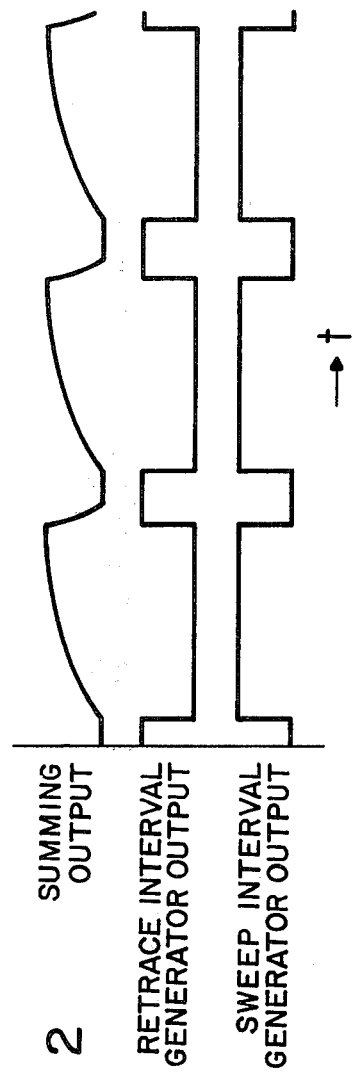
FIG. 2 illustrates several waveforms that appear at various points in the diagram of FIG. 1.

The gate 18 and the gate 34 are operated by signals from a retrace interval generator 40 and a sweep interval generator 41, respectively. The output from the retrace interval generator 40 is also utilized to trigger the sweep interval generator 41 and the output of the sweep interval generator 41 is also used to trigger the retrace interval generator 40 and a sweep generator 42. The retrace and sweep interval generators 40 and 41 are so interconnected that when one is supplying a positive gating signal the other is off and vice versa. Thus, the retrace interval generator 40 closes the gate 18 while the sweep interval generator 41 maintains the gate 34 open and the sweep generator 42 off. Further, when the sweep interval generator 41 turns the sweep generator 42 on and closes the gate 34 the retrace interval generator 40 opens the gate 18. It will be obvious to one skilled in the art that the retrace and sweep interval generators 40 and 41 could be embodied in a single device, such as a multivibrator or the like. The output signals from the retrace and sweep interval generators 40 and 41 are illustrated in FIG. 2 and labeled accordingly. The output of the sweep generator 42 is supplied to a third input of the summing device 20.

In the operation of the generator illustrated in FIG. 1, the retrace interval generator 40 closes the gate 18 to complete the phase lock loop and the sweep interval generator 41 turns off the sweep generator 42 and opens the gate 34. The phase lock loop then locks the output of the oscillator 10 to the output of the reference generator 16. After a short period of time the retrace and sweep interval generators 40 and 41 switch so that the gate 18 is opened and the gate 34 is closed while the sweep generator 42 is turned on. As the sweep generator 42 supplies a sweep signal to the control input 11 of the oscillator 10, the output of the oscillator 10 begins to change, or sweep through the desired range. The output is applied directly to one input of the mixer 27 while a delayed output is applied to the second input thereof. If the output signal rate of change from the oscillator 10 is linear the direct signal and the delayed signal applied to the mixer 27 will produce a constant frequency signal at the output thereof, which will produce a zero error voltage at the output of the discriminator 32. Any nonlinearities in the output signal from the oscillator 10 will appear as a frequency change at the output of the mixer 27 and will be converted to a DC signal varying as a function of frequency error at the output of the discriminator 32. This DC signal will be added to the output of the sweep generator 42 in the summing device 20. In general, since the frequency controlling device in the oscillator 10 will be a nonlinear device, such as a Varicap or the like, the signal applied to the control input 11 will be a nonlinear signal, generally as illustrated in FIG. 2 (labeled Summing Output). Each time the sweep stops and a retrace begins, the retrace and sweep interval generators 40 and 41 switch to connect the oscillator 10 into the phase lock loop so that the basic frequency is locked to the reference generator 16.

Thus, the generator disclosed is periodically locked onto a reference frequency to ensure the correct initial operating frequency, and the linearity of the sweep is continuously monitored during the sweep to ensure a constant rate. Further, because of the continuous monitoring of the rate, the sweep linearity is only dependent upon the capability of the rate error loop and not inhibited by complicated timing and the like.

While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A constant rate sweep frequency generator comprising:
   (a) a variable frequency oscillator including a nonlinear element connected to vary the frequency of said oscillator in accordance with signals applied to the element;
   (b) a phase lock loop including a reference frequency source and means sensing the output frequency of said oscillator for maintaining the output frequency of said oscillator substantially constant relative to the reference frequency;
   (c) a rate error loop including means sensing the output frequency of said oscillator and means providing an output signal indicative of a nonlinear rate of change of the output frequency of said oscillator including linear delay means connected to receive the sensed output from the oscillator and to supply a delayed signal to mixing means which is also connected to receive the sensed output from the oscillator;
   (d) sweep generator means providing a periodic output signal for sweeping said oscillator through a predetermined range of frequencies; and
   (e) switching means for periodically coupling the output signals of said rate error loop and said sweep generator means to the nonlinear element of said oscillator and alternately coupling said nonlinear element into said phase lock loop.

2. A constant rate sweep frequency generator as claimed in claim 1 wherein the mixing means is coupled through filtering means and a discriminator to the nonlinear element of the oscillator.

3. A method of producing a constant rate sweep frequency including the steps of:
   (a) providing a variable oscillator for providing the desired frequency;
   (b) periodically adjusting the oscillator to a predetermined basic or starting frequency;
   (c) supplying a sweep signal to the oscillator to cause the oscillator to sweep through a desired range;
   (d) continuously sensing the frequency linearity of the output signal of the oscillator and continuously adjusting the sweep signal until the output signal frequency rate of change is substantially linear.

4. A method of producing a constant rate sweep frequency as claimed in claim 3 wherein the step of sensing the linearity of the output signal of the oscillator includes determining the rate of change of the frequency of the output signal and adjusting the sweep signal until the rate is substantially linear.

* * * * *